United States Patent
Ramaswami et al.

(10) Patent No.: US 8,797,082 B2
(45) Date of Patent: Aug. 5, 2014

(54) APPARATUS AND METHODS FOR CLOCK CHARACTERIZATION

(71) Applicant: Apple Inc., Cupertino, CA (US)

(72) Inventors: Ravi K. Ramaswami, Cupertino, CA (US); Geertjan Joordens, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/629,919

(22) Filed: Sep. 28, 2012

(65) Prior Publication Data

US 2014/0091841 A1 Apr. 3, 2014

(51) Int. Cl.
 *H03K 3/00* (2006.01)

(52) U.S. Cl.
 USPC .......................... 327/293; 327/292; 327/295

(58) Field of Classification Search
 USPC ......... 327/291, 292, 293, 295, 296, 297, 160, 327/231, 243, 250, 251, 254, 263, 265, 269, 327/273
 See application file for complete search history.

(56) References Cited

U.S. PATENT DOCUMENTS

| | | |
|---|---|---|
| 5,898,905 A | 4/1999 | Aldridge et al. |
| 6,647,433 B1 | 11/2003 | Hayden et al. |
| 7,075,351 B2 * | 7/2006 | Berkram et al. ............. 327/238 |
| 7,587,189 B2 | 9/2009 | Buznitsky et al. |
| 2008/0126655 A1 | 5/2008 | Baier et al. |
| 2011/0089987 A1 * | 4/2011 | Yang ............................ 327/295 |
| 2012/0005385 A1 | 1/2012 | Hsu |

* cited by examiner

*Primary Examiner* — Lincoln Donovan
*Assistant Examiner* — Jung H Kim
(74) *Attorney, Agent, or Firm* — Rory D. Rankin; Meyertons, Hood, Kivlin, Kowert & Goetzel, P.C.

(57) ABSTRACT

A system and method for efficiently performing timing characterization of high-speed clocks signals with low-speed input/output pins. An integrated circuit includes a clock generator that generates a high-speed clock signal. A clock characterizer circuit receives the high-speed clock signal. The clock characterizer generates a corresponding low-speed clock signal. The generated low-speed clock signal is output through a low-speed general-purpose input/output (GPIO) pin for measurement. The generated low-speed clock signal is sent to a sequential element for staging. The staging of the generated low-speed clock signal is done with sequential elements that use a reverse polarity of a clock signal than the polarity used by a previous stage. The high-speed clock signal is used for the staging. The output of each stage is sent to a low-speed GPIO pin for measurement.

14 Claims, 5 Drawing Sheets

APPARATUS AND METHODS FOR CLOCK CHARACTERIZATION

BACKGROUND OF THE INVENTION

1. Field of the Invention

This invention relates to electronic circuits, and more particularly, to efficiently performing timing characterization of high-speed clocks signals with low-speed input/output pins.

2. Description of the Relevant Art

Manufacturing processing defects and variations increased as the integration of chip functionality has increased. Advances in manufacturing processing allowed chip functionality to increase as geometric dimensions of devices and metal routes on semiconductor chips reduced. The defects and variations may greatly affect the functionality and performance of on-die circuits. The manufacturing defects may cause a given signal route, such as a clock signal, to significantly vary from expected behavior. For example, the clock duty cycle may vary from expected values. Additionally, the clock signal may have an appreciable amount of clock jitter.

During a debug process of a chip design, designers may spend a significant amount of time attempting to find and fix failures. Soft failures from clock cycle variations and appreciable clock jitter may cause both consistent and inconsistent failure patterns. A significant amount of effort and time may be used to determine the root cause of these patterns. Further, a first batch of semiconductor wafers may be processed in a similar time span by the same equipment. Still, the silicon dies in this first batch of wafers may include varying clock signal parameters due to process variations. The clock signal behavior may vary from expected behavior in a common manner due to the similar processing conditions. However, other silicon dies in a second batch of wafers may be processed at another time and/or possibly on other equipment. The clock signal behavior may vary from expected behavior in a different manner from dies in the first batch. Therefore, debugging the chips on the wafers becomes even more difficult.

Further still, reliably characterizing high-speed signals on the chips may utilize dedicated high-speed input/output (I/O) pins, such as general-purpose I/O (GPIO) pins. However, these types of pins are expensive. Additionally, adding more GPIO pins may not be possible with a fixed pinout of a die package.

In view of the above, methods and mechanisms for efficiently performing timing characterization of high-speed clocks signals with low-speed input/output pins are desired.

SUMMARY OF EMBODIMENTS

Systems and methods for efficiently performing timing characterization of high-speed clocks signals with low-speed input/output pins in an integrated circuit are contemplated. In various embodiments, an integrated circuit includes at least one clock generator capable of generating one or more high-speed clock signals. One or more clock characterizers may be placed in designated locations across the integrated circuit. A given one of the clock characterizers may receive one or more high-speed clock signals used by sequential elements on the integrated circuit. The clock characterizer may select a given one of the received high-speed clock signals and generate a corresponding low-speed clock signal.

The generated low-speed clock signal may be output through a low-speed general-purpose input/output (GPIO) pin for measurement. In addition, the generated low-speed clock signal may be sent to a sequential element for staging. The staging of the generated low-speed clock signal may be done with sequential elements that use a reverse polarity of a clock signal than the polarity used by a previous stage. The clock signal used by the staging sequential elements may be the selected high-speed clock signal. The output of each stage may be sent to a low-speed GPIO pin for measurement. The phase difference of the low-speed output clock signals may be used to measure the duty cycle of the selected high-speed clock signal. In addition, calibration measurements may be performed to remove skews in the circuitry that add error to the duty cycle and jitter measurements.

These and other embodiments will be further appreciated upon reference to the following description and drawings.

Figure 1:
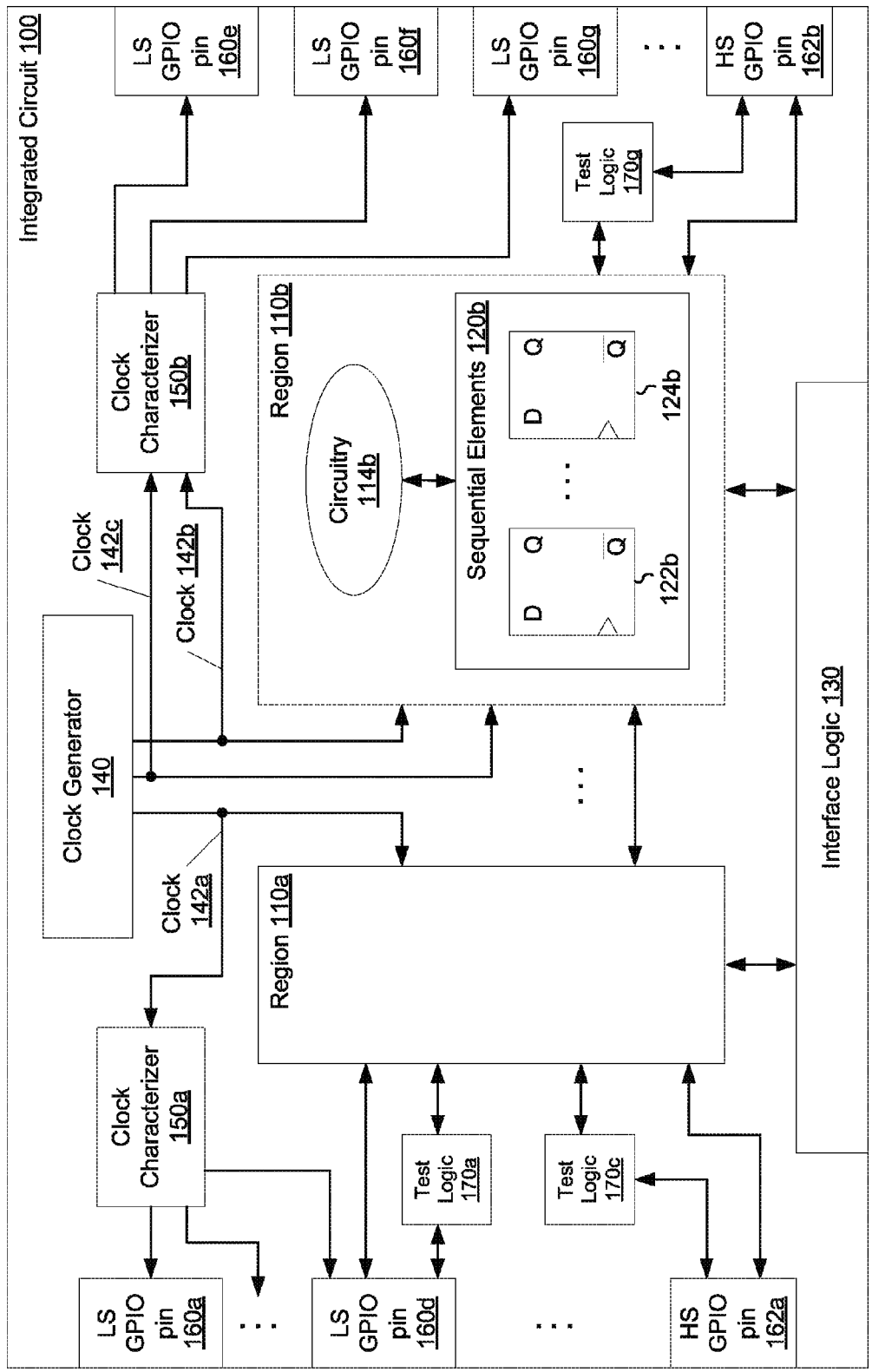
FIG. 1 is a generalized block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention.

Referring now to FIG. 1, a generalized block diagram illustrating one embodiment of an integrated circuit 100 is shown. The integrated circuit 100 may be any semiconductor device. Examples of the integrated circuit 100 may include a processing core within a general-purpose microprocessor, a general-purpose microprocessor, an application specific integrated circuit (ASIC), a system-on-a-chip (SOC), a graphics processing unit (GPU), a programmable gate array (PGA), and so forth. Each one of these integrated circuit examples may include one or more pipeline stages. In addition, a given one of these integrated circuit examples may execute instructions from an instruction set architecture (ISA) distinct from another ISA executed by one or more other integrated circuits of the integrated circuit examples. In one example, a SOC includes multiple integrated circuit dies, wherein two or more of the dies execute instructions from distinct instruction set architectures (ISAs).

The integrated circuit 100 may be a die on a semiconductor wafer, a standalone packaged part, a packaged part within a printed circuit board (pcb), and so forth. The integrated circuit may use any available transistor technology. Examples may include at least complementary metal oxide semiconductor (CMOS) technology, transistor-to-transistor logic (TTL) technology, and bipolar junction transistor (BJT) technology. Additionally, the integrated circuit 100 may be included as one or more instantiations within one of the above examples, such as a GPU, a SOC, and so forth.

As shown, the integrated circuit 100 may include a clock generator 140, physical regions 110a-110b and interface logic 130. Multiple general-purpose input/output (GPIO) pins may be placed at the pinout of the integrated circuit (IC) 100. For example, low-speed (LS) GPIO pins 160a-160g and high-speed (HS) GPIO pins 162a-162b are located on the pinout of the IC 100. The HS GPIO pins 162a-162b may offer more complex and flexible functionality than the LS GPIO pins 160a-160g in addition to supporting higher signal frequencies. Accordingly, the HS GPIO pins may be relatively more expensive than the LS GPIO pins 160a-160b and significantly add to the cost of manufacturing the IC 100.

Although a single clock generator 140 and two physical regions 110a-110b are shown, the integrated circuit 100 may include multiple clock generators and several regions. Each of the regions 110a-110b may include a clock characterizer. For example, the region 110a may include at least a clock characterizer 150a and the region 110b may include at least a clock characterizer 150b. One or more clock characterizers may be included in other areas of the integrated circuit 100.

The clock generator 140 may include one or more phase lock loops (PLLs) to generate source clock signals. The clock generator 140 may use one or more types of PLLs to generate the source clocks signals. For example, an integer PLL may be used. Alternatively, a fractional PLL may be used to generate multiple clock signals with different clock frequencies from a single clock crystal. The source clock signals may be routed through a clock tree (not shown) to be distributed across the die of the IC 100 and to provide core clocks to the various processing blocks on the IC 100. Each one of the regions 110a-110b may include one or more processing blocks or functional units. The clock output signals 142a-142c may be source clock signals or core clock signals to be characterized. The choice of which level of the clock generation hierarchy to characterize may depend on the designers and available routing paths.

As shown, the region 110b may include circuitry 114b and sequential elements 120b. The circuitry 114b may be used to perform arithmetic operations, binary logical operations, data comparisons, data conversions, and the like. The sequential elements 120b may include one or more data storage elements 122b and 124b that utilize a clock signal to synchronize data storage and updates. The storage elements 122b and 124b may generally include registers, flip-flops, latches, content addressable memory (CAM), random access memory (RAM), caches, and so forth. Similarly, the region 110a may include circuitry and sequential elements that provide a similar functionality as the region 110b. In addition, the region 110a may provide a subset of the functionality or additional functionality of the region 110b.

The interface logic 130 may include input/output (I/O) over-voltage protection devices, queues for storing requests and corresponding response data, and any suitable I/O protocol logic. The integrated circuit 100 may also include test logic 170a-170g for both sending test inputs to the regions 110a-110b and receiving test outputs from the regions 110a-110b. For example, the test logic 170a-170g may include circuitry and logic to support the Joint Test Action Group (JTAG) test logic. This type of logic follows the IEEE 1149.1 Standard Test Access Port and Boundary-Scan Architecture. Other types of test logic may also be used.

As shown, each of the LS GPIO pins 160a-160g and HS GPIO pins 162a-162b may receive one or more inputs. For example, the LS GPIO pin 160d receives inputs from the clock characterizer 150a, the region 110a, and the test logic 170a. The LS GPIO pin 160d may include a multiplexer at its input to receive multiple inputs, select a given one of the inputs, and send the selected input to the internal logic. Alternatively, in other implementations, a multiplexer may be placed outside the LS GPIO pin 160d for receiving multiple inputs and selecting a given one to send to the LS GPIO pin 160d. Similarly, the other GPIO pins in the IC 100 may have multiplexing logic placed inside or outside the pin circuitry when multiple inputs are used.

In some embodiments, both the LS GPIO pins 160a-160g and the HS GPIO pins 162a-162b may provide signal transmission in either direction. In other embodiments, only the HS GPIO pins 162a-162b offer bidirectional signal transmission. At least the HS GPIO pins 162a-162b may be programmed to accept input signals from a source in the integrated circuit 100 and send the input signal to one or more external devices. A source in the integrated circuit 100 may be one or more of the clock characterizers 150a-150b, the regions 110a-110b, the test logic 170a-170g, and so forth. Similarly, the HS GPIO pins 162a-162b may be programmed to receive input signals from an external device and send the input signal to a destination in the integrated circuit 100. Examples of the destinations within the IC 100 may be the same as the examples for the sources within the IC 100. The programming of the HS GPIO pins 162a-162b may depend on the direction of a designer and/or the requirements of one or more software applications being executed.

The HS GPIO pins 162a-162b may also include circuitry and logic for handling analog-to-digital conversion (ADC), digital-to-analog conversion (DAC), interrupt handling, and so forth. The complex and flexible functionality provided by the HS GPIO pins 162a-162b make the HS GPIO pins 162a-162b relatively expensive to use. Therefore, the number of HS GPIO pins may be limited to control the cost of manufacturing the integrated circuit 100.

On-die process variation may cause spatially varying timing characteristics within the IC 100. In addition, process variation may cause varying timing characteristics between the IC 100 and an external device. The timing characteristics may include at least line delays of metal routes, gate delays, setup and hold times for sequential storage elements, operational clock frequency, clock duty cycle, and clock jitter.

During the manufacturing processing steps, the base layers are inserted in an n-type or a p-type silicon substrate. The base layers include the n-well, p-well, diffusion, and polysilicon layers. Manufacturing defects such as relatively high resistive vias, holes in conductors, mismatches in masks for the base layers, and so forth may cause a given data path to significantly vary from an expected delay. In addition, setup and/or hold time violations may occur creating incorrect results. Stuck-at faults may also occur. In the cases of the stuck-at faults, the IC 100 malfunctions. In other cases, such as varying transistor sizes, varying leakage current amounts, and the like, the IC 100 may fail at higher speeds, but provide correct results at lower speeds or frequencies. Determining at least the clock signal(s) varies from expected performance may allow some dies on wafers to be placed in particular bins according to the measured parameters.

Regardless of whether the clock signal(s) causes failures for typical use of a given die or causes variations from expected performance that leads to binning, determining either case for the clock(s) may be a time consuming and difficult task. A clock signal may be routed to a dedicated HS GPIO pin and sent to test equipment for clock characterization. However, routing each one of multiple high-speed clock signals to a respective dedicated HS GPIO pin significantly adds to the cost of the IC 100. Additionally, dedicated use of HS GPIO pins for the high-speed clock signals consumes pinout real estate that may not be available.

An alternative to using dedicated HS GPIO pins for clock characterization may be using the clock characterizers 150*a*-150*b* followed by using LS GPIO pins. For example, the clock signal 142*a* output by the clock generator 140 may be sent to the clock characterizer 150*a* in addition to being sent to the region 110*a*. Similarly, the clock signal 142*b* output by the clock generator 140 may be sent to the clock characterizer 150*b* in addition to being sent to the region 110*b*. The clock signal 142*c* may be output by the clock generator 140 and sent to each of the region 110*b* and the clock characterizer 150*b*.

Each of the clock characterizers 150*a*-150*b* may receive one or more clock signals to characterize. For example, the high-speed clock signal 142*b* is sent to the clock characterizer 150*b*. The clock characterizer 150*b* may select the clock signal 142*b* from the input clock signals 142*b*-142*c* and generate a corresponding low-speed clock signal. Additionally, the clock characterizer 150*b* may generate one or more other clock signals by combining each of the received high-speed clock signal 142*b* and the produced low-speed clock signal. The clock characterizer 150*b* may use combinatorial logic and sequential elements to generate the one or more other clock signals.

The one or more other low-speed clock signals generated by the clock characterizer 150*b* may have waveform edges that may be used to measure the clock duty cycle and the clock jitter of the received high-speed clock signal 142*b*. The one or more other low-speed clock signals may be output to low-speed (LS) GPIO pins. As shown, the clock characterizer 150*b* sends low-speed clock signals to the LS GPIO pins 160*e*-160*g*. These low-speed clock signals may be used by external measurement equipment to determine the clock duty cycle and the clock jitter of the received high-speed clock signal 142*b*.

Figure 2:
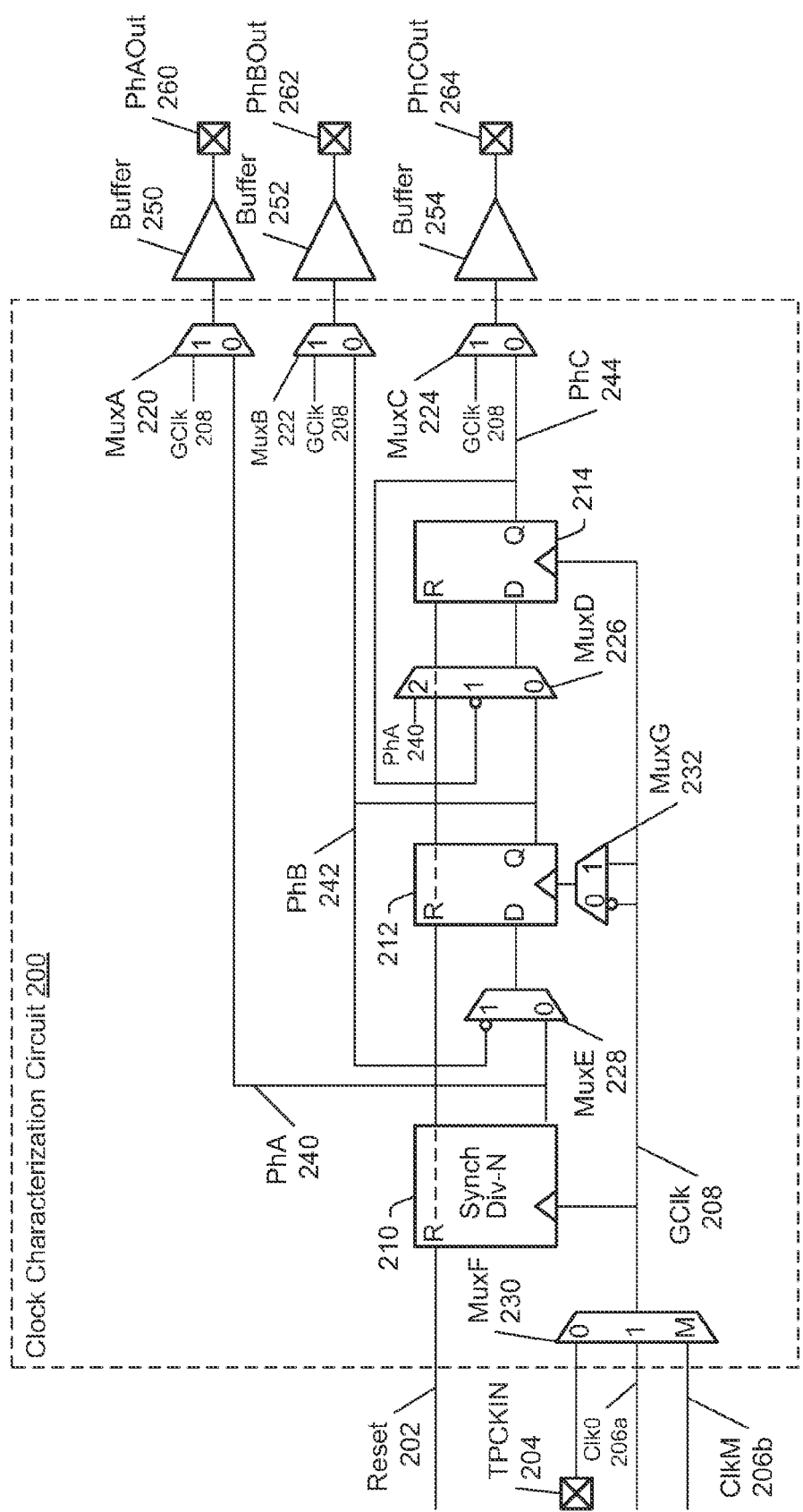
FIG. 2 is a generalized block diagram of one embodiment of a clock characterization circuit.

Referring now to FIG. 2, a generalized block diagram of one embodiment of a clock characterization circuit 200 is shown. As shown, the clock characterization circuit 200 may receive high-speed clock signals Clk0 206*a* and ClkM 206*b*. Although two input clock signals are shown, another number of input clock signals may be used. The input clock signals 206*a*-206*b* may be received from clock generation circuitry on an integrated circuit. An input test clock signal TPCKIN 204 may be received from a test input pin on the pinout of an integrated circuit. The multiplexer MuxF 232 may receive the input clock signals. The select line for the multiplexer MuxF 230 and the other multiplexers 220-230 in the circuit 200 are not shown for ease of illustration. However, the values used on the select lines for the multiplexers 220-232 are described during different stages of operation of the circuit 200.

The select line(s) for MuxF 230 may be set to choose a given one of the input clock signals 204 and 206-206*b* to be characterized. The output clock signal of MuxF 230, which is the clock signal GClk 208, is sent to a Divide-by-N counter 210. In addition, the clock signal GClk 208 is sent to the flip-flop 212 through multiplexer MuxG 232, the flip-flop 214, and the multiplexers MuxA 220, MuxB 222, and MuxC 224.

The Divide-by-N counter 210 may output the low-speed clock signal PhA 240. Control signals may be set for the Divide-by-N counter 210 to set the output PhA 240 signal with a frequency within the limits of a low-speed (LS) GPIO pin. For example, the GClk 208 signal may be a multi-gigahertz (GHz) clock signal and the PhA 240 signal may have a frequency in a range of a few hundred megahertz (MHz). In some embodiments, the control signals for the Divide-by-N counter 210 may set the divisor N to a prime number in order to randomize the output phase of the PhA 240 signal with respect to the frequency of the GClk 208 signal.

The PhA 240 signal may be output to the PhAOut pin 260 through the multiplexer MuxA 220 and the buffer 250. In some embodiments, the buffer 250 is an input of a LS GPIO pin. Similarly, the buffers 252-254 may be inputs of LS GPIOs. The PhA 240 signal may also be routed to an input of the multiplexer MuxD 226. The output of MuxD 226 may be sent to the data input of the flip-flop 214. The PhA 240 signal may also be routed to an input of the multiplexer MuxE 228. The output of MuxE 228 may be sent to the data input of the flip-flop 212. The MuxE 228 may select between the PhA 240 signal and an inverted value of the data output of the flip-flop 212.

The MuxG 232 may select between a non-inverted value and an inverted value of the GClk 208 signal. The output of MuxG 232 may be sent to the clock input of the flip-flop 212. The PhB 242 signal is the data output of the flip-flop 212. The PhB 242 signal is sent to the inverted input of MuxE 228. Additionally, the PhB 242 signal is sent to MuxD 226 and MuxB 222. The output of MuxD 226 is sent to the data input of the flip-flop 214. The output of MuxD 226 is selected between the PhA 240 signal, the inverted output of the flip-flop 214, and the PhB 242 signal.

The PhC 244 signal is the output of the flip-flop 214. The PhB 242 signal and the PhC 244 signal are sent to the PhBOut 262 pin and the PhCOut 264 pin through the multiplexers MuxB 222 and MuxC 224, respectively, and the buffers 252 and 254, respectively. Similar to the buffer 250 and the PhAOut 260 pin, the buffers 252 and 254 may be combined with the pins 262 and 264, respectively, within a LS GPIO.

Each of the flip-flops 210-214 may be reset with the input reset signal 202. The flip-flops 212 and 214 may be used to phase shift the PhA 240 signal at a negative edge and a positive edge of the GClk 208 signal. External measuring and test equipment may measure the low-speed output signals, PhAOut 260, PhBOut 262, and PhCOut 264. The measurements may be used to find the duty cycle and jitter of the high-speed GClk 208 signal. In some embodiments, the clock characterization circuit 200 may include scan logic and multiplexers used for automatic test pattern generation (ATPG) purposes. In addition, one or more multiplexers may be placed before the buffers 250-254 to allow sharing of the pins 260-264 with other data, control, and test signals.

Figure 3:
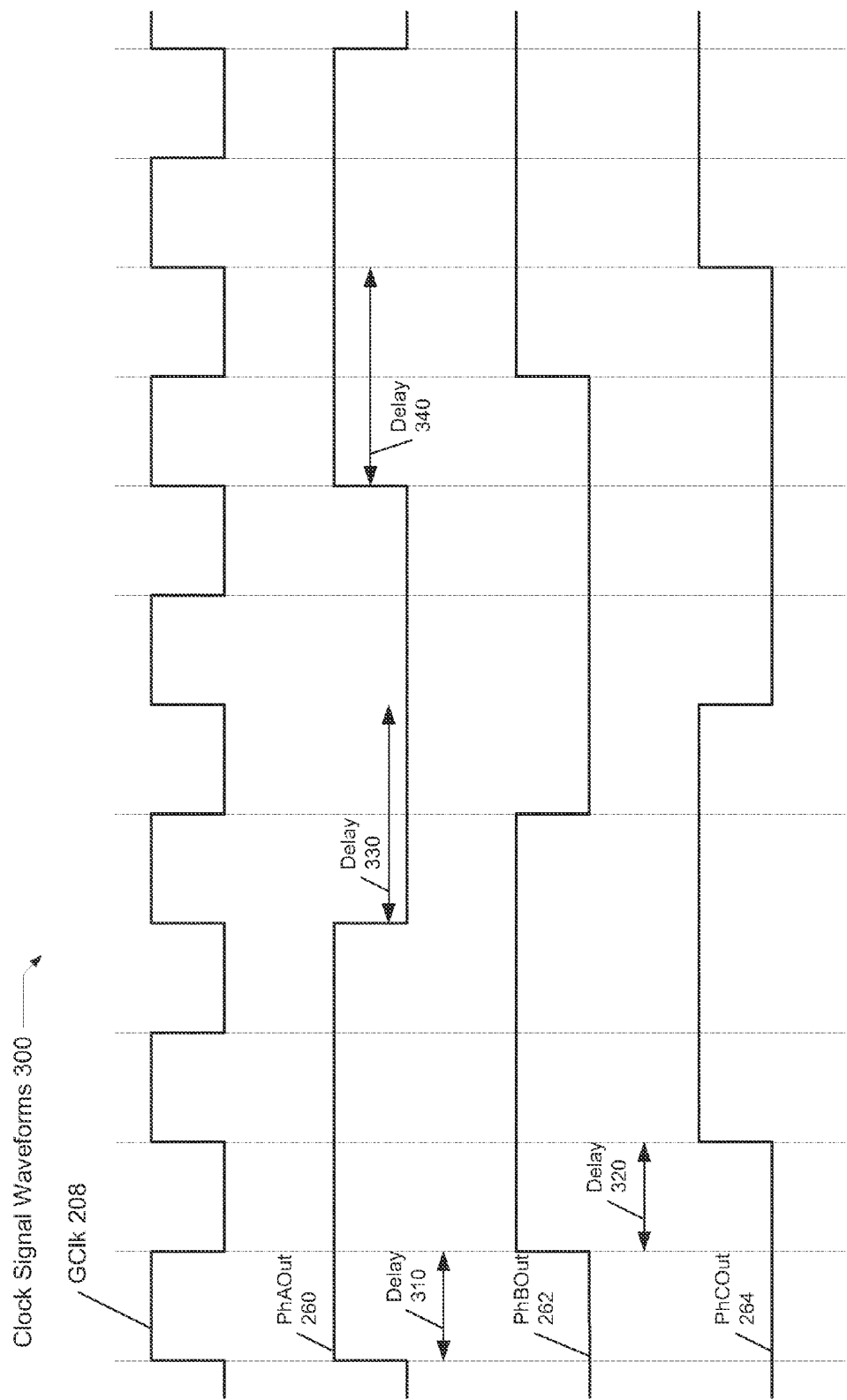
FIG. 3 is a generalized block diagram of clock signal waveforms for measuring duty cycle and jitter.

Turning now to FIG. 3, a generalized block diagram illustrating one embodiment of clock signal waveforms 300 for measuring duty cycle and jitter is shown. With the circuit implementation shown in the circuit 200, the select lines for each of the multiplexers MuxA 220 to MuxG 232 may be set to 0. The selected high-speed clock signal GClk 208 may toggle as shown after a relatively small delay through the MuxF 230. In the illustrated example, PhA 240 has one fourth of the frequency of GClk 208. More scaling down of the frequency of GClk 208 may typically be performed, but using one quarter of the frequency is used for ease of illustration.

The signal PhA 240 is output from the Divide-by-N counter 210 shown in the circuit 200 of FIG. 2. As shown in FIG. 3, the signal PhAOut 260 transitions on a positive edge of the signal GClk 208, but with half of the frequency of the signal GClk 208. In contrast, the signal PhBOut 262 transitions on a negative edge of the signal GClk 208, but it also has half of the frequency of the signal GClk 208. The signal PhCOut 264 has one-fourth of the frequency of the signal GClk 208 and transitions on a positive edge of the signal GClk 208.

The duty cycle of the selected signal GClk 208 may be found from at least the phase difference between the signals PhBOut 262 and PhAOut 260. This delay, shown as delay 310, may be compared to an expected value and provide the portion of the duty cycle wherein the signal GClk 208 is asserted. The duty cycle of the selected signal GClk 208 may be found from at least the phase difference between the signals PhCOut 264 and PhBOut 262. This delay, shown as delay 320, may be compared to an expected value and provide the portion of the duty cycle wherein the signal GClk 208 is deasserted.

The clock period jitter for the signal GClk 208 may be found from the phase difference between the signals PhCOut 264 and PhAOut 260. The measured delays 330 and 340 may be compared to expected values and provide the clock jitter for the signal GClk 208. Multiple measurements may be performed and a statistical analysis may be performed on the stored results to determine a typical clock jitter value.

In some embodiments, the select lines for MuxD 226 may be set to 2 allowing the PhA 240 signal to be input to the data input of the flip-flop 214, rather than the data output of the flip-flop 212. This setting of the MuxD 226 may bypass the half-cycle path and allow the clock jitter to be directly measured. The half-cycle path may be difficult to satisfy timing requirements as the clock frequencies increase. Therefore, setting the select lines for MuxD 226 to 2 allows the PhA 240 signal to directly be sent to the flip-flop 214 when higher clock frequencies are being characterized.

There may be measurement errors when using the circuit 200 for clock characterization. A first source of error may include clock skew within the path from the output of the MuxF 230 to the clock input of the Divide-by-N counter 210 and to the clock input of each of the flip-flops 2121-214. A second source of error may include clock skew through the counter 210 and the flip-flops 212-214. In addition, there may be an appreciable delay through the buffers 250-254 and other circuitry used within the LS GPIO pins. In order to determine these delays, a test input clock signal may be used. For example, referring again to FIG. 2, the TPCKIN 204 signal may be a clock signal provided by an external test and measurement device.

The TPCKIN 204 signal may be supplied on an input pin in the pinout of the integrated circuit. However, there may also exist duty cycle distortion (DCD), wherein the clocks buffers and clock metal routes across the die alter the duty cycle of the TPCKIN 204 signal as it travels the path from the input pin to the MuxF 230. For example, the positive edge of the TPCKIN 204 signal may be affected differently by the clock buffers and the clock metal routes than the negative edge of the TPCKIN 204 signal. In order to account for the DCD effect caused by the path across the die and the clock skews and delays within the clock characterization circuit, an error measurement mode may be performed. The error mode may determine the internal delays within the clock characterization circuit in order to later remove them from measurements of the clock output signals PhAOut 260 to PhCOut 264. Further details of the error measurement mode are provided below.

Figure 4:
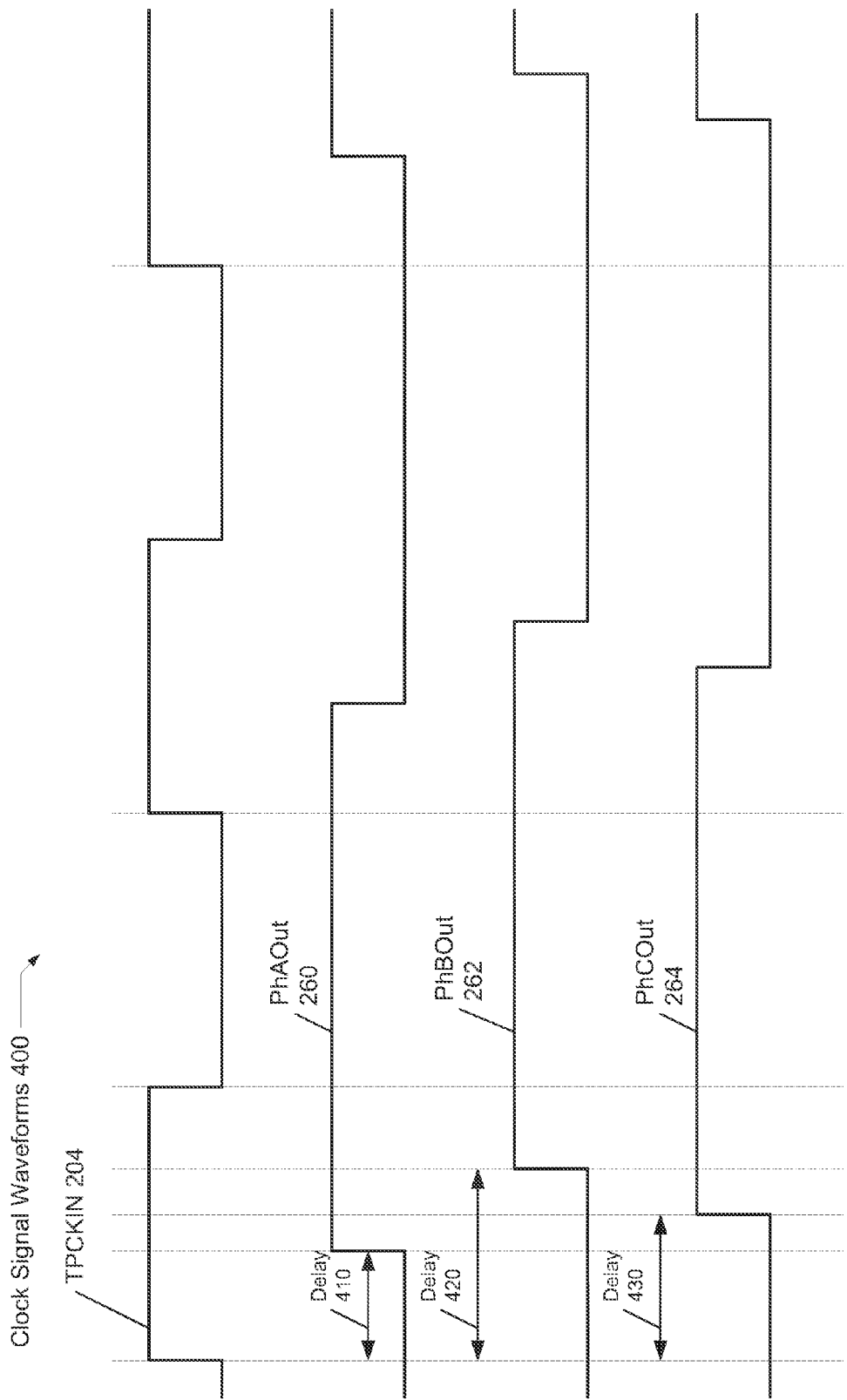
FIG. 4 is a generalized block diagram of clock signal waveforms for measuring skews in a clock characterization system.

Referring now to FIG. 4, a generalized block diagram illustrating one embodiment of clock signal waveforms 400 for measuring skews in a clock characterization system is shown. The test input signal, TPCKIN 204, may be applied to a pin on a pinout of an integrated circuit. The three output signals PhAOut 260, PhBOut 262, and PhCOut 264 may be generated by a clock characterization circuit, such as the circuit 200. The delays 410-430 may be recorded and used to adjust later clock characterization measurements. With the circuit implementation shown in the circuit 200, the select lines for each of the multiplexers MuxA 220, MuxB 222, MuxC 224, and MuxF 230 may be set to 0, whereas the select line(s) for MuxD 226, MuxE 28, and MuxG 232 may be set to 1.

Based on the select lines being set as described above, each of the flip-flops 212-214 receives a non-inverted version of the GClk 208 signal, which in this case is the TPCKIN 204 signal. Each of the counter 210 and the flip-flops 212-214 latches data on a positive edge of the received clock signal, which compensates for the DCD effect. The negative edge of the TPCKIN 204 signal is not used to latch data in the error measurement mode. In addition, based on the select lines being set as described above, the circuit 200 may be placed in a toggle mode to determine the clock skews through the counter 210 and the flip-flops 212-214. In the toggle mode, the Divide-by-N counter 210 may have divisor N set to 2, or half the frequency of the input GClk 208 signal.

After the flip-flops 212-214 are reset, at least two pulses may be applied on the pin for the TPCKIN 204 signal as shown in the waveforms 400. The phase difference between the TPCKIN 204 signal and the three output signals PhAOut 260, PhBOut 262, and PhCOut 264 provides the delays 410-430. An ideal physical layout of the circuit 200 may provide equal delays for each of the delays 410-430. The delays 410-430 may refer to the delay between the edge of the TPCKIN 204 signal and the respective output edges on the pins 260-264. Any measured differences between the delays 410-430 may provide the systematic skew introduced by path delay and input/output (I/O) delay difference.

After measuring the clock skews of the counter 210 and the flip-flops 212-214, the total delay of a clock signal found from calibrating the circuit 200 may include three components. The first component may be the clock arrival time delay to the clock inputs of the counter 210 and the flip-flops 212-214 within the circuit 200. This first component may include the delay from the TPCKIN pin to the MuxF 230 within the circuit 200 and the delay from the MuxF 230 to the clock input of the counter 210 and the flip-flops 212-214. The second component may include the delay from the data output of the counter 210 and the flip-flops 212-214 to the LS GPIO pins. The third component may include the delay through the LS GPIO pins.

Figure 5:
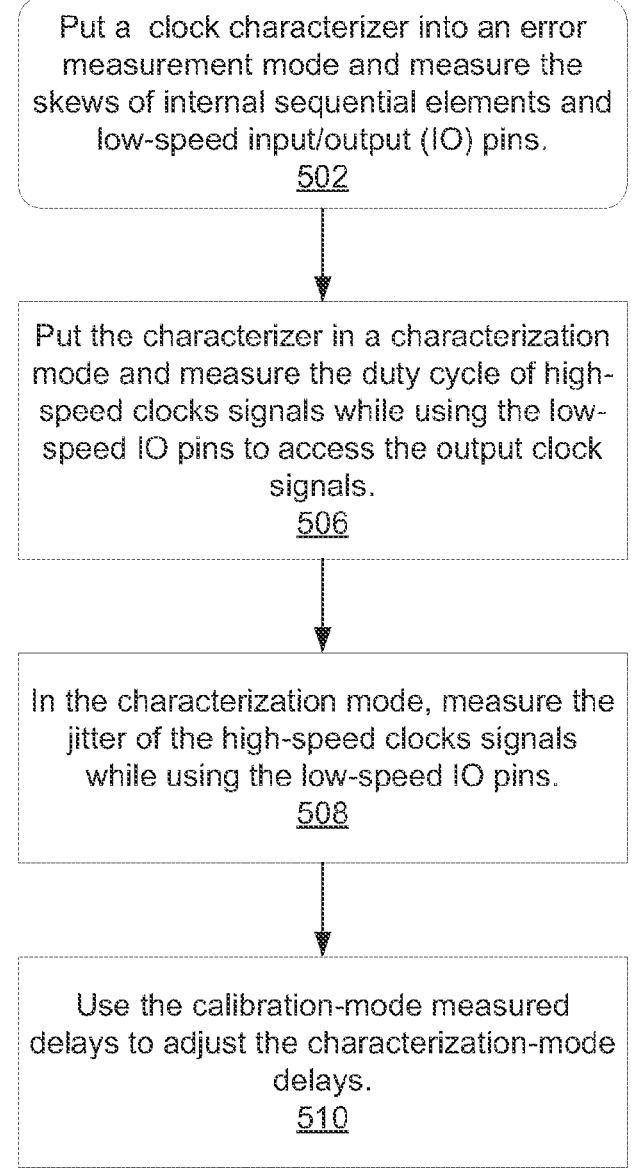
FIG. 5 is a generalized flow diagram of one embodiment of a method for determining clock duty cycle and jitter on an integrated circuit using low-speed input/output (IO) pins.

Referring now to FIG. 5, a generalized flow diagram of one embodiment of a method 500 for determining clock duty cycle and jitter on an integrated circuit using low-speed input/output (IO) pins is shown. For purposes of discussion, the steps in this embodiment are shown in sequential order. However, in other embodiments some steps may occur in a different order than shown, some steps may be performed concurrently, some steps may be combined with other steps, and some steps may be absent.

In block 502, a clock characterizer is put into an error measurement mode measuring the skews of internal sequential elements and low-speed input/output (IO) pins. Control logic may set particular multiplexer select lines to certain values to provide the measurement. In various embodiments, each the sequential elements within the characterizer that are in the path from input clock signal to output clock signal may have a respective data input receive an inverted value of the data output of the same sequential element. In other words, the sequential elements may be set to toggle. A Divide-by-N counter may have the divisor N set to 2 in order to toggle in the received data input.

In various embodiments, the sequential elements within the characterizer that are in the path from input clock signal to output clock signal may have a same polarity of received clock signal. For example, each of the sequential elements, such as flip-flops, may open and capture input data on a positive edge of a clock signal. A duty cycle distortion (DCD) of a test input clock signal may be compensated by having the sequential elements open and capture input data with a same polarity of the test input clock signal. For example, the clock buffers and metal routes used to send a given clock signal from an on-chip clock generator or input pin to an on-chip physical region that uses the clock characterizer may have appreciable delays. The positive edge and the negative edge of the given clock signal may be affected differently.

External test equipment may be used to supply a test clock signal to the clock characterizer. The measured delays compared to the controllable test input clock signal may be recorded. In block 506, the characterizer may be placed in a characterization or signal measurement mode for measuring the duty cycle of on-chip high-speed clocks signals while using the low-speed IO pins to access the output clock signals.

Continuing with the block 506, control logic may set particular multiplexer select lines to certain values to provide the measurement to direct both the data and clock inputs of sequential elements within the characterizer. For example, the sequential elements along the path from input to output may alternate between using a positive and a negative edge clock for capturing data. A given on-chip high-speed clock signal may be selected from multiple high-speed clock signals. The selected high-speed clock signal may be input into logic to produce a low-speed clock signal based on the high-speed clock signal. For example, a Divide-by-N counter may receive the high-speed clock signal and produce a low-speed clock signal with a clock frequency significantly smaller than the frequency of the high-speed clock signal.

The generated low-speed clock signal may be output for measurement. In addition, the generated low-speed clock signal may be sent to a sequential element for staging. The staging of the generated low-speed clock signal may be done with sequential elements that use a reverse polarity of a clock signal than the polarity used by a previous stage. The clock signal used by the staging sequential elements may be the selected high-speed clock signal. The output of each stage may be sent to low-speed GPIO pins for measurement. The phase difference of the low-speed output clock signals may be used to measure the duty cycle of the selected high-speed clock signal.

In block 508, while still in the characterization mode, the characterizer may be used for measuring the jitter of the high-speed clock signals while using the low-speed IO pins. The same output clock waveforms used for the duty cycle measurement may be used for the clock jitter measurement. The phase difference of the low-speed output clock signals may be used to measure the jitter of the selected high-speed clocks signal.

In block 510, the calibration-mode measured delays may be used to adjust the measurements found in the characterization-mode. The measurements for each of the calibration-mode and the measurement-mode may be collected and have statistical analysis performed. The delays may be combined in a manner to remove inherent skews in clock buffers, metal routes, the sequential elements within the characterizer, and the low-speed GPIO pins. These delays may be removed from a total delay leaving behind more accurate measurements of the actual duty cycle and jitter of the selected high-speed clock signal.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist comprising a list of gates from a synthesis library.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit comprising:
   a plurality of physical regions comprising circuitry; and
   one or more characterizers within one or more of the physical regions, wherein respective circuitry within a characterizer of the one or more characterizers is configured to:
   receive a first clock signal;
   generate a second clock signal with a frequency less than a frequency of the first clock signal; and
   generate a plurality of other clock signals by combining each of the first clock signal and the second clock signal in sequential logic;
   wherein the sequential logic comprises a divide-by-N counter and a plurality of flip-flops including a first flip-flop and a second flip-flop, each configured to receive the first clock signal as a clock input;
   wherein in response to detecting an error measurement mode for determining skew in the sequential logic, the respective circuitry is further configured to:
   select a same polarity of the first clock signal as the clock input of each of the divide-by-N counter, the first flip-flop, and the second flip-flop; and select a test clock signal to be received as the first clock signal, wherein the test clock signal is generated by external test equipment wherein in response to detecting a mode different from the error measurement mode, the respective circuitry is configured to select an opposite polarity of the first clock signal as the clock input of the first flip-flop.

2. The integrated circuit as recited in claim 1, wherein the respective circuitry is further configured to select a prime number for a divisor of the divide-by-N counter.

3. The integrated circuit as recited in claim 1, wherein in response to detecting a measurement mode, the respective circuitry is further configured to:
   select a data output of the divide-by-N counter as a data input of the first flip-flop of the plurality of flip-flops, wherein the second clock signal is the data output of the divide-by-N counter; and
   select an inverted value of the first clock signal as the clock input of the first flip-flop.

4. The integrated circuit as recited in claim 3, wherein in response to being in the measurement mode, the respective circuitry is further configured to:
   select a data output of the first flip-flop as a data input of the second flip-flop of the plurality of flip-flops; and
   select a non-inverted value of the first clock signal as the clock input of the second flip-flop.

5. The integrated circuit as recited in claim 4, wherein the respective circuitry is further configured to send the second clock signal and the plurality of other clock signals to measurement equipment through low-speed general-purpose input/output (LS GPIO) pins, wherein the plurality of other clock signals include at least data outputs of the first flip-flop and the second flip-flop.

6. The integrated circuit as recited in claim 5, wherein the respective circuitry is further configured to select a divisor of the divide-by-N counter such that the frequency of the second clock signal generated by the divide-by-N counter is less than a maximum threshold frequency supported by the LS GPIO pins.

7. The integrated circuit as recited in claim 1, wherein in response to a setup time of the second flip-flop is not being met, the respective circuitry is further configured to send said second clock signal in place of the data output of the first flip-flop to the data input of the second flip-flop.

8. The integrated circuit as recited in claim 1, wherein in response to detecting the error measurement mode, the respective circuitry is further configured to:
   select a value of 2 for a divisor for the divide-by-N counter; and
   select an inverted data output of a given flip-flop of the first flip-flop and the second flip-flop as the data input for the given flip-flop.

9. A method comprising:
   receiving a first clock signal in a physical region of a plurality of physical regions on a die;
   generating a second clock signal with a frequency less than a frequency of the first clock signal; and
   generating a plurality of other clock signals by combining each of the first clock signal and the second clock signal in sequential logic;
   wherein the sequential logic comprises a divide-by-N counter and a plurality of flip-flops including a first flip-flop and a second flip-flop, each configured to receive the first clock signal as a clock input;
   wherein in response to detecting an error measurement mode for determining skew in the sequential logic, the method further comprises:
      selecting a same polarity of the first clock signal as the clock input of each of the divide-by-N counter, the first flip-flop, and the second flip-flop; and
      selecting a test clock signal to be received as the first clock signal, wherein the test clock signal is generated by external test equipment wherein in response to detecting a mode different from the error measurement mode, the method further comprises selecting an opposite polarity of the first clock signal as the clock input of the first flip-flop.

10. The method as recited in claim 8, wherein in response to detecting a measurement mode, the method further comprises:
   selecting a data output of the divide-by-N counter as a data input of a first flip-flop of the plurality of flip-flops, wherein the second clock signal is the data output of the divide-by-N counter; and
   selecting an inverted value of the first clock signal as the clock input of the first flip-flop.

11. The method as recited in claim 10, wherein in response to being in the measurement mode, the method further comprises:
   selecting a data output of the first flip-flop as a data input of the second flip-flop of the plurality of flip-flops; and
   selecting a non-inverted value of the first clock signal as the clock input of the second flip-flop.

12. The method as recited in claim 11, wherein the method further comprises sending the second clock signal and the plurality of other clock signals to measurement equipment through low-speed general-purpose input/output (LS GPIO) pins, wherein the plurality of other clock signals include at least data outputs of the first flip-flop and the second flip-flop.

13. The method as recited in claim 12, wherein the method further comprises selecting a divisor of the divide-by-N counter such that the frequency of the second clock signal generated by the divide-by-N counter is less than a maximum threshold frequency supported by the LS GPIO pins.

14. The method as recited in claim 1, wherein in response to detecting the error measurement mode, the method further comprises:
   selecting a value of 2 for a divisor for the divide-by-N counter; and
   selecting an inverted data output of a given flip-flop of the first flip-flop and the second flip-flop as the data input for the given flip-flop.

* * * * *

UNITED STATES PATENT AND TRADEMARK OFFICE
CERTIFICATE OF CORRECTION

| | | |
|---|---|---|
| PATENT NO. | : 8,797,082 B2 | Page 1 of 1 |
| APPLICATION NO. | : 13/629919 | |
| DATED | : August 5, 2014 | |
| INVENTOR(S) | : Ravi K. Ramaswami and Geertjan Joordens | |

It is certified that error appears in the above-identified patent and that said Letters Patent is hereby corrected as shown below:

In the Claims:

Column 11, Claim 1, Line 3, please delete "equipment wherein" and substitute -- equipment; wherein --.

Column 12, Claim 9, Line 16, please delete "equipment wherein" and substitute -- equipment; wherein --.

Column 12, Claim 10, Line 25, please delete "of a first" and substitute -- of the first --.

Signed and Sealed this
Eleventh Day of November, 2014

Michelle K. Lee
*Deputy Director of the United States Patent and Trademark Office*